United States Patent
Kim

(10) Patent No.: US 7,960,750 B2
(45) Date of Patent: Jun. 14, 2011

(54) LIGHT EMITTING DIODE PACKAGE

(75) Inventor: Wan Ho Kim, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 12/815,044

(22) Filed: Jun. 14, 2010

(65) Prior Publication Data

US 2010/0244080 A1 Sep. 30, 2010

Related U.S. Application Data

(63) Continuation of application No. 12/552,911, filed on Sep. 2, 2009, which is a continuation of application No. 11/583,043, filed on Oct. 19, 2006, now Pat. No. 7,592,638.

(30) Foreign Application Priority Data

Oct. 19, 2005 (KR) ........................ 10-2005-0098594

(51) Int. Cl.
*H01L 33/00* (2010.01)

(52) U.S. Cl. ..... 257/98; 257/99; 257/100; 257/E33.072; 257/E33.075

(58) Field of Classification Search .................. 257/98, 257/99, 100, E33.072, E33.075
See application file for complete search history.

(56) References Cited

U.S. PATENT DOCUMENTS

| | | | |
|---|---|---|---|
| 7,218,041 B2 | 5/2007 | Isoda | |
| 7,271,423 B2 | 9/2007 | Hanamoto et al. | |
| 7,282,853 B2 | 10/2007 | Yano et al. | |
| 2004/0079957 A1* | 4/2004 | Andrews et al. | 257/100 |
| 2004/0129945 A1 | 7/2004 | Uemura | |
| 2004/0188696 A1 | 9/2004 | Hsing Chen et al. | |
| 2004/0208210 A1 | 10/2004 | Inoguchi | |
| 2004/0222433 A1 | 11/2004 | Mazzochette et al. | |
| 2005/0133698 A1 | 6/2005 | Oniki et al. | |
| 2006/0092644 A1 | 5/2006 | Mok et al. | |
| 2006/0124953 A1* | 6/2006 | Negley et al. | 257/99 |
| 2008/0043444 A1 | 2/2008 | Hasegawa et al. | |

OTHER PUBLICATIONS

Office Action in U.S. Appl. No. 12/683,929 mailed Mar. 31, 2011.

* cited by examiner

*Primary Examiner* — Minh-Loan T Tran
(74) *Attorney, Agent, or Firm* — Birch, Stewart, Kolasch & Birch, LLP

(57) ABSTRACT

A light emitting diode package including a substrate; a plurality of electrodes on the substrate; a light emitting diode on the substrate; at least one wire connecting the light emitting diode and at least a first electrode of the plurality of electrodes; a reflecting member formed around the light emitting diode and being spaced apart from the light emitting diode; a cavity included in the reflecting member; a mold material including in the cavity; and a heat sink disposed under the light emitting diode and configured to emit heat generated by the light emitting diode. Further, a connection portion connecting the plurality of electrodes extends under a surface of the substrate through a portion of the substrate, and an inside surface of the reflecting member has a step-shape structure.

8 Claims, 4 Drawing Sheets

LIGHT EMITTING DIODE PACKAGE

This application is a continuation of application Ser. No. 12/552,911, filed on Sep. 2, 2009, which is a continuation of application Ser. No. 11/583,043, filed on Oct. 19, 2006 now U.S. Pat. No. 7,592,638, for which priority is claimed under 35 U.S.C. §120, and this application claims priority of Application No. 10-2005-0098594, filed in the Republic of Korea on Oct. 19, 2005 under 35 U.S.C. §119; the entire contents of all are hereby incorporated by reference.

BACKGROUND OF THE INVENTION

1. Field of the Invention

The present invention relates to a light emitting diode and a package of a light emitting diode.

2. Description of the Related Art

A light emitting diode (LED) is a light emitting device constituting a light source by using compound semiconductor materials such as GaAs, AlGaAs, GaN, InGaN, and AlGaInP. The LED has the advantage of emitting various colors on materials of the semiconductor.

Generally, the characteristics of the LED are determined according to high-luminance light-emitting, luminance, color range of the emitted light, and the like. The characteristics of the LED device are primary determined by the compound semiconductor materials used in the LED device. Also, the characteristics are secondly determined by package construction for mounting a chip. Especially, in order to obtain distribution of a luminance angle according to high luminance and user requirements, the primary element of the materials is limited. So, recently, many people are interested in the package construction.

The second element of the LED package construction largely affects the luminance and the high-luminance light-emitting. Referring to a conventional package illustrated in FIGS. 1A through 1C, a lamp type LED and a surface mounted type LED will be described, separately.

For a lamp type LED package 10 illustrated in FIG. 1A, a metal electrode face of a cup shape with a predetermined angle is provided on the upper side of a lead frame 3B among two lead frames 3A, 3B. An LED device 5 is mounted on the upper side of the metal electrode face. Also, the lamp type LED 10 is packaged by a domed case 7 which is made of transparent molding resin.

On the other hand, as illustrated in FIG. 1B, a surface mounted type LED package 20 has a package 11 which is made of molding epoxy resin. Also, an LED device 15 is arranged on a mounting region where an inclined angle is small, and an electrode (not shown) is connected by a wire 13.

By such package construction, in the lamp type LED package 10, the domed case 7 working as a lens, can control the luminance. Especially, by making the distribution of the luminance angle narrow, the luminance at a predetermined luminance angle can be raised. Also, light which is emitted from a source is reflected on the metal electrode face of the cup shape to raise the luminance. When comparing with the lamp type LED package 10, in the surface mounted type LED package 20, distribution of the luminance angle is made wide by the package 11, and the luminance itself is low. In this manner, the luminance and the distribution of the luminance are largely affected by the package construction. Therefore, in the case of the surface mounted type LED package 20 using molding resin, a development to add a reflecting member is being processed. The reflecting member is a metalized construction having a predetermined reflecting angle and formed at one side of the mounting region.

However, since the construction of the LED package using the molding resin does not have high enough thermal resistance for heat generated by high luminance light, the LED package is not appropriate for the high-luminance emitting-light.

FIG. 1C is a sectional view illustrating a ceramic LED package which is made of a conventional ceramic substrate.

Referring to FIG. 1C, a construction 30 of the ceramic LED package has two ceramic substrates 21 and 22. Each the ceramic substrate has a plurality of ceramic sheets which are laminated. Mounting region for an LED device 25 is located on a lower ceramic substrate 21. An electrode 23 which is connected to the LED device 25 by a wire 27 is extended, through both sides of the ceramic substrates, from the mounting region to the bottom of the substrate. An upper ceramic substrate 22 having a predetermined cavity surrounds the mounting region for the LED device 25.

Here, since the cavity for the mounting region receiving the LED device 25 is formed by punching or cutting, a cutting face is vertically formed at all times as illustrated in FIG. 1C. Therefore, it is difficult to form a reflecting face which can control the luminance angle by making a predetermined inclined plane inside of the cavity. In addition, it makes a manufacturing process complicated and increases the cost that the ceramic substrate 22 supplying the cavity is made of the plurality of substrates which are laminated.

Also, since the heat which is generated by the high luminance light is emitted through only the electrode 23, emitting heat is not rapid, which has a bad influence on characteristics of operation of the LED device 25. Therefore, an LED package which can efficiently emit heat in a ceramic package has been strongly required.

In addition, it takes manufacturing time longer and increase the cost, because the ceramic substrate 22 is made of the plurality of substrates which are laminated.

SUMMARY OF THE INVENTION

Accordingly, the present invention is related to a light emitting diode package that substantially obviates one or more problems due to limitations and disadvantages of the related art.

The embodiment of the present invention provides an LED package comprising: a substrate, an electrode or more formed in the substrate, an LED mounted on a side of the substrate and electrically connected to the electrode, and at least one heatsink hole formed to pass through the substrate, for emitting heat generated from the LED to the outside.

The embodiment of the present invention provides an LED package comprising: a substrate, an electrode or more formed in the substrate, an LED mounted on one side of the substrate and electrically connected to the electrode, a heatsink portion formed in the substrate, for emitting out heat generated from the LED, and a reflecting member formed around the LED, for reflecting light emitted from the LED, the reflecting member being injection molded.

The embodiment of the present invention provides an LED package comprising: a substrate, an LED mounted on one side of the substrate, for emitting light using an external power, at least one heatsink hole formed in a portion of the substrate that is aligned with the LED, for emitting out heat generated from the LED, and a reflecting member formed of a resin and separately coupled on the substrate around LED, for reflecting light emitted from the LED.

The embodiment of the present invention provides an LED package comprising: a substrate, an LED mounted on one side of the substrate, for emitting light using an external power, a plurality of heatsink holes each having a diameter of about 50-100 μm and formed in at least a portion of the substrate that is aligned with the LED, for emitting out heat generated from the LED, and a reflecting member formed of a resin and formed outside the LED, for reflecting light emitted from the LED.

For the LED package of the embodiment of the invention, it is easy to control luminance according to the luminance and an angle. Since heat is efficiently emitted, the LED package is easily applicable to a high luminance LED. Also, by manufacturing the LED package with a simple construction, the manufacturing process is convenient and the cost is low.

BRIEF DESCRIPTION OF THE DRAWINGS

FIGS. 1A through 1C are conventional constructions of an LED package, wherein FIG. 1A is a sectional view illustrating an lamp type LED package, FIG. 1B is a sectional view illustrating a surface mounted type LED package, and FIG. 1C is a sectional view illustrating a ceramic LED package;

DETAILED DESCRIPTION OF THE INVENTION

Hereinafter, preferred embodiments of the present invention will be described in detail with reference to the accompanying drawings.

Figure 1A:
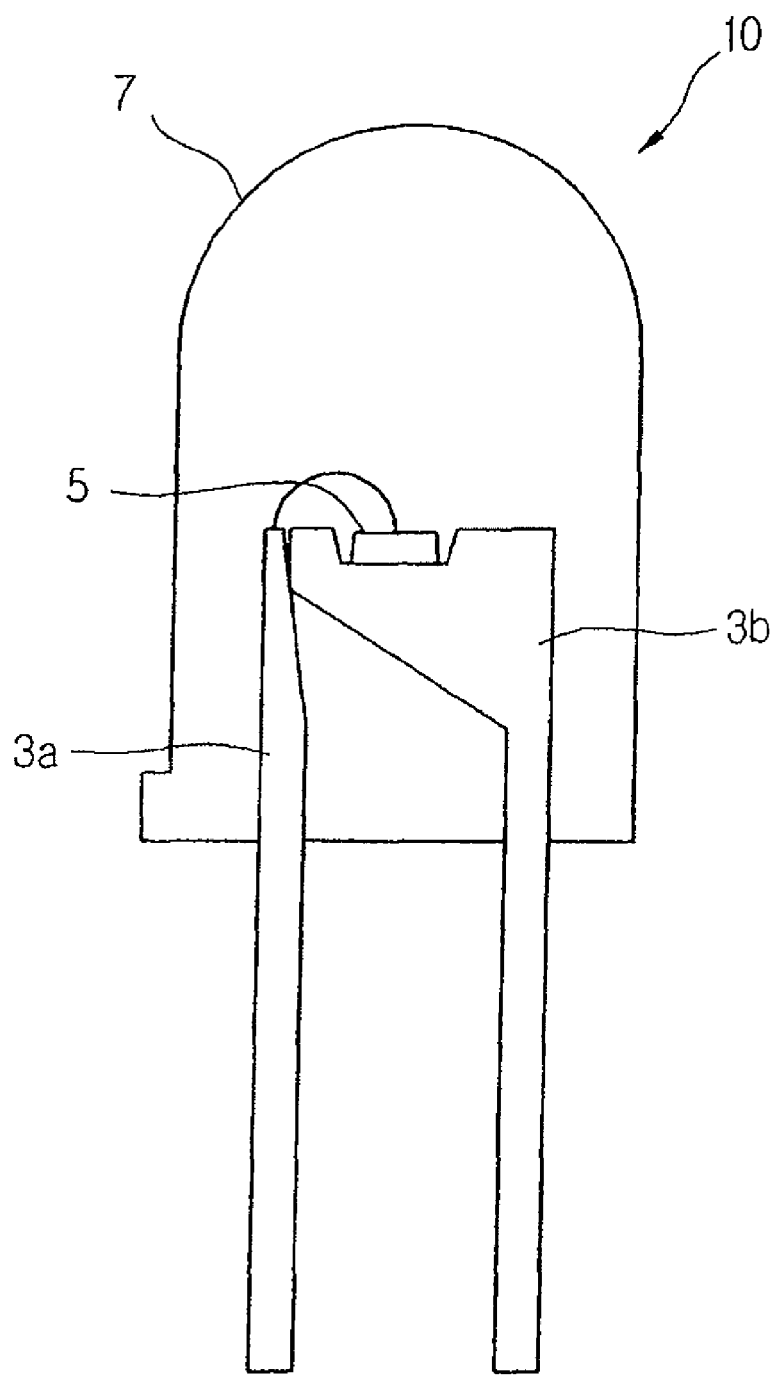
Figure 1B:
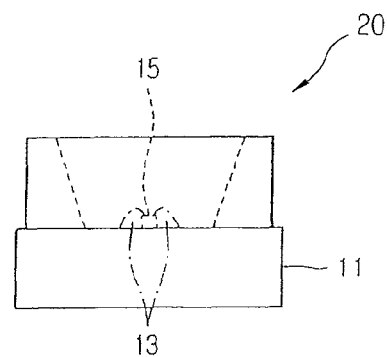
Figure 1C:
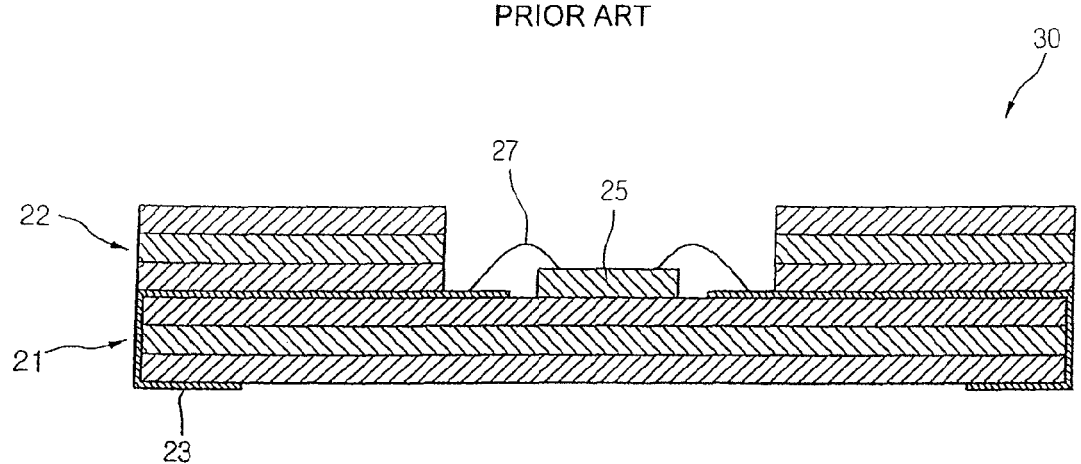
Figure 2:
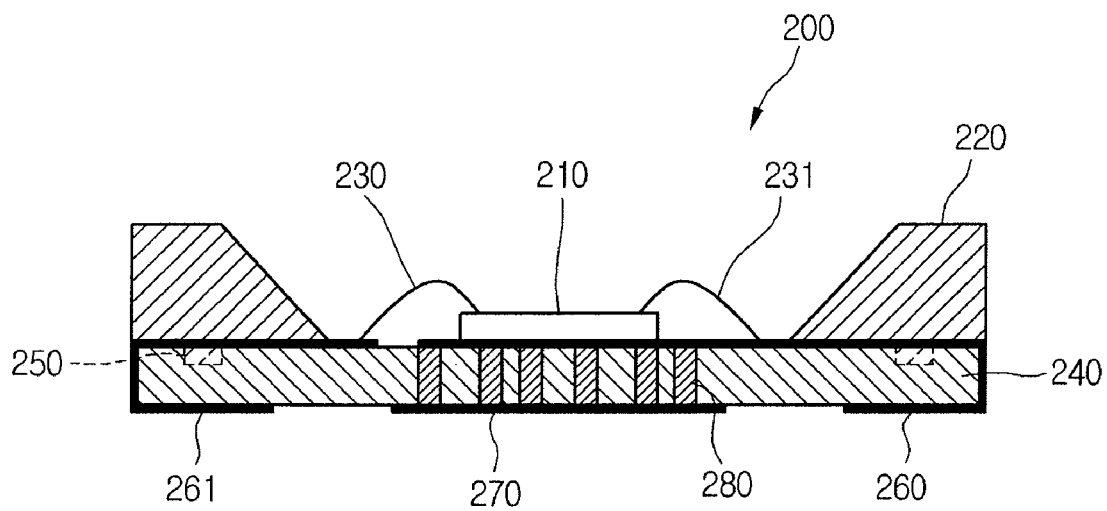
FIG. 2 is a sectional view illustrating an LED package according to the present invention.

FIG. 2 is a sectional view illustrating an LED package 200 according to the present invention.

Referring to FIG. 2, the LED package 200 of the present invention includes a ceramic substrate 240, an LED 210 mounted on the upper side of the ceramic substrate 240, a reflecting member 220 formed around the portion in which the LED 210 is mounted, an electrode 260 and 261 and wire 230 and 231 provided on the upper side of the ceramic substrate 240 and electrically connected to the LED 210, and a heat sink 270 and a heatsink hole 280 emitting out heat generated from the LED 210.

In detail, since the ceramic substrate 240 is provided as a single layer, it is possible to reduce the manufacturing process and take the manufacturing time shorter.

Figure 3:
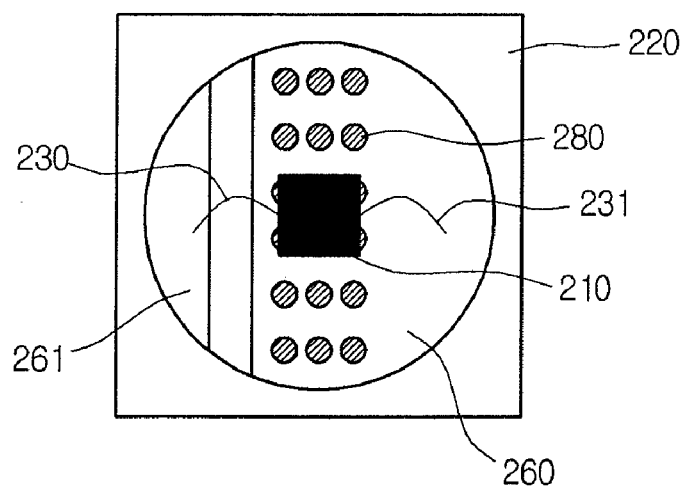
FIG. 3 is a plan view illustrating the LED package according to the present invention.

Also, it is advantageous for the improvement of luminance and the control of a luminance angle that the reflecting member 220 is provided surrounding all around the LED 210. In detail, the reflecting member 220 may be made of polypropylene (PP) having a high reflectance coating and the inner surface may be cylindrical as illustrated in FIG. 3. Further, the shape of the inner surface of the reflecting member 220 is that the upper diameter may be larger than the lower diameter. The reason is because, although it achieves some increase in luminance to insert the reflecting member 220 which is formed as a cylindrical type into the mounting region, it may increase the luminance of the entire light as well as the luminance of upward light to control the difference of the diameters by making the lower diameter be smaller than the upper diameter.

The reflecting member 220 can be easily made by such as a PP injection molding. A metal layer (not shown) such as Al, Ag is formed on the inner surface of the reflecting member 220 for reflection. Also, a plurality of protruding contact portions 250 may be provided on the lower side of the reflecting member 220 in order to be bonded to the ceramic substrate 240. The protruding contact portions 250 not only guide the reflecting member 220 for bonding to an appropriate position of the ceramic substrate 240 but also strengthen the bonding between the ceramic substrate 240 and the reflecting member 220.

Also, the electrode 260 and 261 is provided for the electrical conduction and the thermal conduction, wherein the electrode 260 is extended to the bottom through the side of the ceramic substrate 240 and supplies a run current to the LED 210 through the wire 230 and 231 as illustrated in FIG. 3. By the electrode 260 which is provided further to the bottom of the LED 210, heat generated from the LED 210 is more rapidly transmitted downward to be emitted downward through the heatsink hole 280 or be emitted into the side along the electrode 260 itself. As a matter of course, when the electrode 260 does not work like this, the electrode 260 is provided not as a plate type but as a wire type on the ceramic substrate 240 and just conducts electricity.

The heat sink 270 is provided on the bottom of the ceramic substrate 240, facing the LED 210 and having a predetermined shape, for example, a circular type or a tetragonal type, and contacts the heatsink hole 280 to emit the heat of the LED transmitted through the heatsink hole 280.

The heatsink hole 280 has a plurality of holes having the diameter of about 50-100 μm in the ceramic substrate 240. A metal material, for example, Ag is filled in the heatsink hole 280 by electroplating or a metal deposition. The heat sink 270 is united with the heatsink hole 280. Since the filler in the heatsink hole 280 has high thermal conductivity, it is apparent that a great quantity of heat is more rapidly transmitted through the heatsink hole 280.

The process of the configuration of the LED package 200 will be described in the following in more detail.

First, the plurality of heatsink holes 280 are formed in the ceramic substrate 240 which is made of a single layer by a mechanical method or chemical etching. Also, Ag is filled in the heatsink holes 280 by electroplating or a metal deposition.

After filling Ag in the heatsink holes 280, the electrode 260 and the heat sink 270 are formed in order to cover all the heatsink holes 280 and the LED 210 is mounted on a predetermined position of the electrode 260. Subsequently, the wire 230 and 231 is formed in order to be connected to the LED 210 and the electrode 260 and 261, respectively.

Figure 4:
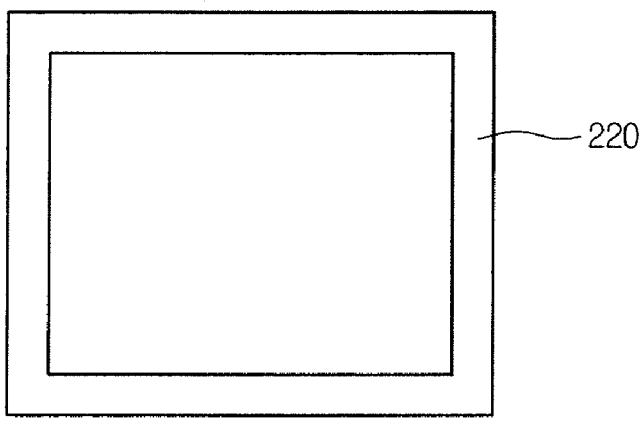
FIG. 4 is a plan view illustrating a reflecting member in an LED package according to another embodiment of the present invention.

The reflecting member 220 is bonded to the ceramic substrate 240 by the plurality of protruding contact portions 250 and a silicon based bonding material, to surround the mounting region of the LED 210. As a matter of course, for the protruding contact portions 250 by being just fitted into the ceramic substrate 240, the reflecting member 220 may be bonded or by only a bonding material without the protruding contact portions 250, the reflecting member 220 may be bonded. However, it improves the bonding strength and the workability to bond around the protruding contact portions 250 after the reflecting member 220 is guided by the protruding contact portions 250. Here, the reflecting member 220 which is bonded may be the tetragonal type illustrated in FIG. 4 as well as the circular type illustrated in FIG. 3.

In addition, since the reflecting member 220 is simply bonded to the single layer ceramic package, the manufacturing process of the ceramic package becomes simple and the characteristics of the luminance can be improved through the material of the reflecting member 220 and the reflectance coating.

After the reflecting member 220 is bonded, on the upper side of the LED 210, namely on a cavity formed inside the reflecting member 220, a molding lens (not shown) can be further formed by filling a transparent epoxy resin or a silicon based resin.

Figure 5:
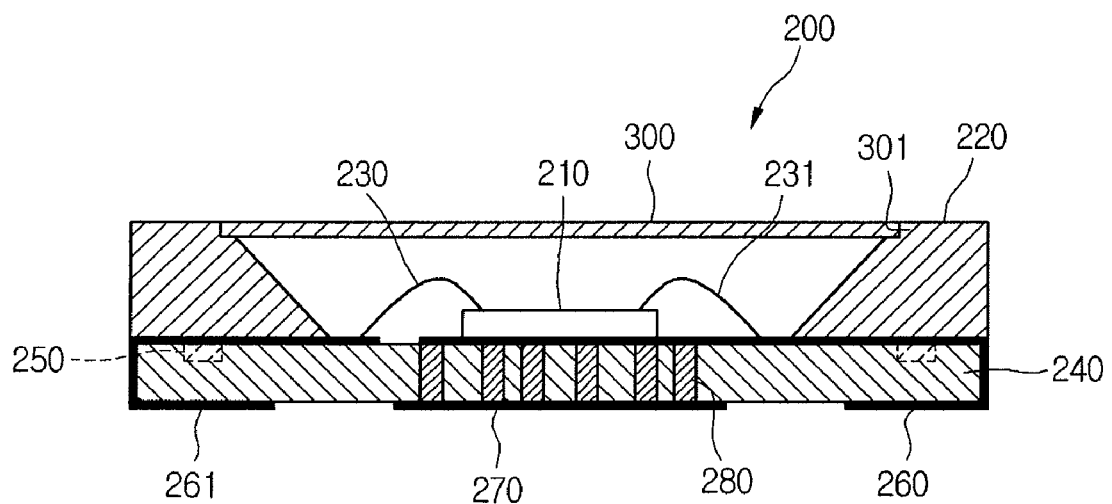
FIG. 5 is a sectional view illustrating a package describing the embodiment of the present invention.

FIG. 5 is a sectional view illustrating a package describing another embodiment of the present invention. When compared with FIG. 2, only parts which are characteristically different are described and the others follow the descriptions in the precedent embodiment.

Referring to FIG. 5, a lens placing part 301 for placing a lens 300 is further formed in a reflecting member 220. The prepared lens 300 is placed on the lens placing part 301. This type is more convenient for attaching the lens 300. The reason is because the reflecting member 220, as a single part, is previously prepared by injection molding to easily provide the lens placing part 301, that the lens 300 is conveniently placed.

According to other embodiment, by further forming an additional supporting member in the reflecting member 220, when a mold material is filled in a cavity provided in the reflecting member 220, the mold material and the reflecting member 220 can be more strongly supported.

According to still other embodiment, although metal may be filled in the heatsink holes, it is possible to emit thermal by only air, without a filler.

According to the present invention as described above, the following Industrial applicability and advantageous effect can be obtained. First, it makes the manufacturing process of the LED package more simple, and makes the shape of the reflecting member 220 more appropriate and preferable that the reflecting member 220 is bonded on the ceramic substrate 240 by the bonding material after the reflecting member 220 is made by an additional process such as the injection molding. For example, for the inner shape of the reflecting member 220, the inclined angle of the inclined plane is more variously controlled and the inclined plane may be formed to have a direction. That is, the inner shape of the reflecting member 220 is various on the shape that user wants.

According to the present invention, under the construction of the LED package 200, since heat generated from the LED 210 is transmitted to the electrode 260, the heatsink holes 280, and the heat sink 270 to be emitted, the problems in the thermal stress and the degradation of an LED device which are caused by heat can be solved. Therefore, since the heat generated from the LED 210 is emitted downward at minimum distance through the heatsink holes 280 provided in the mounting region of the LED 210, the reliability of the LED 210 can be guaranteed. Further, since the heat is emitted along the electrode 260, the heat emitting efficiency is more improved. Therefore, a high luminance LED can be also stably supported without the degradation, and the reliability of the high luminance LED package is improved.

In addition, since the reflecting member 220 is simply bonded to the single layer ceramic substrate 240, the manufacturing process of the ceramic package becomes simple.

Also, since the ceramic substrate 240 is a single layer, it does not have to be laminated. Therefore, the manufacturing process becomes more simple.

In addition, since the reflecting member 220 is made of not a conventional metal material but a PP material, the weight of the ceramic package can be reduced. Since the reflecting member 220 is made by a resin injection molding, the construction of the reflecting member 220 is various and is made conveniently on the shape that user wants.

What is claimed is:

1. A light emitting diode package, comprising:
a substrate;
a light emitting diode on the substrate;
a metal layer on the substrate and electrically connected to the light emitting diode;
a reflecting member having a cavity around the light emitting diode;
a molding member filled in the cavity provided in the reflecting member; and
a hole formed to pass through the substrate and configured to connect both upper and bottom surfaces of the substrate,
wherein a bottom surface of the metal layer directly contacts the substrate so there is not a space between the bottom surface of the metal layer and the substrate,
wherein a bottom surface of the reflecting member has at least two surfaces different in height with reference to an edge of the bottom surface of the reflecting member,
wherein the reflecting member has at least one protruding portion protruding with reference to an imaginary surface where the light emitting diode is disposed, the at least one protruding portion not being located at an edge of the reflecting member, and
wherein the reflecting member is a different material than a material of the substrate.

2. The light emitting diode package of claim 1, wherein the at least one protruding portion protrudes downwards away from the imaginary surface where the light emitting diode is disposed.

3. The light emitting diode package of claim 1, wherein the at least one protruding portion includes two protruding portions.

4. The light emitting diode package of claim 3, wherein the at least two protruding portions are disposed at outside edges of the light emitting diode.

5. The light emitting diode package of claim 1, wherein a width of the at least protruding portion is larger than a depth of the at least one protruding portion.

6. The light emitting diode package of claim 1, wherein the at least one protruding portion is disposed away from an outside edge of the light emitting diode.

7. The light emitting diode package of claim 6, wherein the reflecting member includes two inclined surfaces inclining upwards away from the light emitting diode.

8. The light emitting diode package of claim 7, wherein the at least one protruding portion is disposed under one of the inclined surfaces of the reflecting member.

* * * * *